(12) United States Patent
Chen et al.

(10) Patent No.: US 9,767,228 B2
(45) Date of Patent: Sep. 19, 2017

(54) DETERMINING A DEPLOYMENT OF AN ACCESS CONTROL SYSTEM

(71) Applicant: Honeywell International Inc., Morristown, NJ (US)

(72) Inventors: Henry Chen, Beijing (CN); Jian Geng Du, Beijing (CN); Michelle Raymond, Minneapolis, MN (US); Vit Libal, Praha (CZ); Jan Jelinek, Naples, FL (US); Valerie Guralnik, Mound, MN (US)

(73) Assignee: Honeywell International Inc., Morris Plains, NJ (US)

( * ) Notice: Subject to any disclaimer, the term of this patent is extended or adjusted under 35 U.S.C. 154(b) by 247 days.

(21) Appl. No.: 14/161,503

(22) Filed: Jan. 22, 2014

(65) Prior Publication Data
US 2015/0206361 A1    Jul. 23, 2015

(51) Int. Cl.
*G07C 9/00* (2006.01)
*G06F 17/50* (2006.01)

(52) U.S. Cl.
CPC ................................ *G06F 17/5004* (2013.01)

(58) Field of Classification Search
CPC .... G07C 9/00; G07C 9/00912; G08B 25/008; G08B 13/00
See application file for complete search history.

(56) References Cited

U.S. PATENT DOCUMENTS

| | | | |
|---|---|---|---|
| 2007/0219645 A1* | 9/2007 | Thomas | G05B 15/02 700/29 |
| 2010/0023252 A1* | 1/2010 | Mays | G01C 21/20 701/533 |
| 2010/0057354 A1* | 3/2010 | Chen | G01C 21/20 701/533 |
| 2010/0214284 A1* | 8/2010 | Rieffel | G06T 17/00 345/419 |

(Continued)

FOREIGN PATENT DOCUMENTS

| | | |
|---|---|---|
| JP | 2009060201 | 3/2009 |
| KR | 1237414 | 2/2013 |
| WO | 2012171138 | 12/2012 |

OTHER PUBLICATIONS

Yoosef Asen. "Building Information Modeling Based Integration and Visualization for Facilities Management". Department of Building, Civil and Environmental Engineering, Concordia University. Jun. 2012, pp. 1-114.

(Continued)

*Primary Examiner* — Nabil Syed
(74) *Attorney, Agent, or Firm* — Brooks, Cameron & Huebsch, PLLC

(57) ABSTRACT

Methods, devices, and computer-readable media for determining a deployment of an access control system are described herein. One method includes extracting a plurality of two-dimensional spaces from a building information model of a facility, determining a plurality of connections between the plurality of spaces, defining a zone of the (Continued)

facility, wherein the zone includes a subset of the plurality of spaces and a subset of the plurality of connections between the spaces, and associating an access reader with a particular connection of the subset of the plurality of connections located on a boundary of the zone.

18 Claims, 7 Drawing Sheets

(56) References Cited

U.S. PATENT DOCUMENTS

| | | | |
|---|---|---|---|
| 2011/0001604 A1* | 1/2011 | Ludlow | G07C 9/00103 340/5.6 |
| 2011/0082638 A1* | 4/2011 | Khorashadi | G01C 21/20 701/532 |
| 2011/0133884 A1* | 6/2011 | Kumar | G07C 9/00 340/5.22 |
| 2012/0086549 A1* | 4/2012 | Barnes, Jr. | G06Q 10/1053 340/5.61 |
| 2013/0050483 A1 | 2/2013 | Itoh et al. | |
| 2014/0180996 A1* | 6/2014 | Kulusjarvi | G06N 5/00 706/47 |

OTHER PUBLICATIONS

"Integrated Systems". Axis Communications AB. May 5, 2013. www.axis.com/products/video/about_networkvideo/integrated_systems.htm. 3 pages.

* cited by examiner

DETERMINING A DEPLOYMENT OF AN ACCESS CONTROL SYSTEM

TECHNICAL FIELD

The present disclosure relates to methods, devices, and computer-readable media for determining a deployment of an access control system.

BACKGROUND

Access control systems can selectively restrict access to places and/or other resources (e.g., computing devices) of various facilities (e.g., buildings, plants, refineries, etc.). An access control system may be an important aspect of security and safety throughout spaces of a facility.

Previous approaches to deploying access control systems may involve manual definition of boundaries, security zones and/or access policies associated with a facility. Approaches using such manual definition may be time-consuming and/or inconsistent, for instance. Further, such approaches may pose difficulties associated with future updates following change(s) in spaces of a facility (e.g., due to construction, remodeling, etc.).

DETAILED DESCRIPTION

Figure 1:
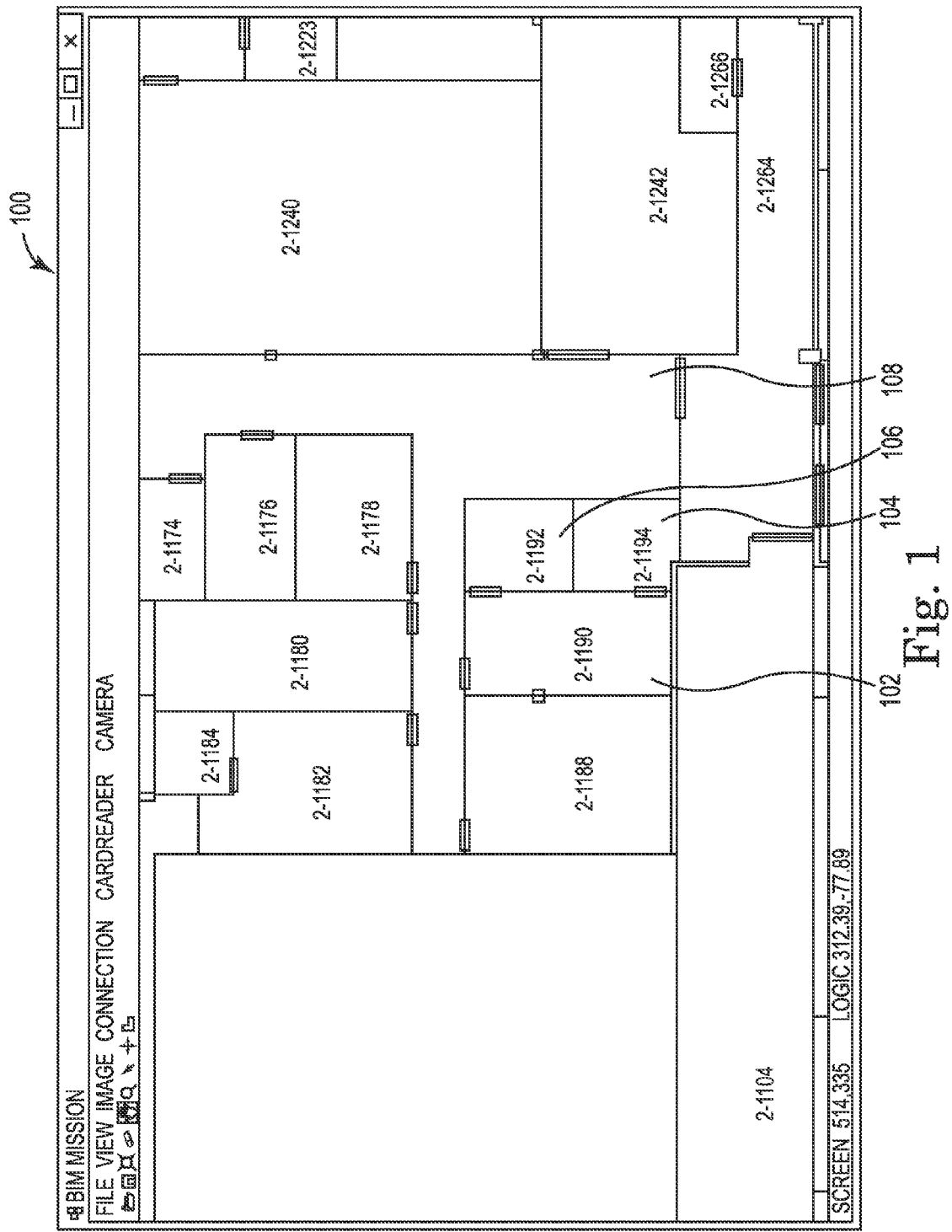
FIG. 1 is an example of a display associated with a plurality of two-dimensional spaces extracted from a building information model of a facility according to one or more embodiments of the present disclosure.

Devices, methods, and systems for determining a deployment of an access control system are described herein. For example, one or more embodiments include extracting a plurality of two-dimensional spaces from a building information model of a facility, determining a plurality of connections between the plurality of spaces, defining a zone of the facility, wherein the zone includes a subset of the plurality of spaces and a subset of the plurality of connections between the spaces, and associating an access reader with a particular connection of the subset of the plurality of connections located on a boundary of the zone.

Access control system deployment in accordance with one or more embodiments of the present disclosure can automate boundary definition and/or placement of access readers associated with a facility, for instance. Accordingly, embodiments herein can save configuration time and enhance consistency over previous approaches.

Additionally, embodiments of the present disclosure can determine an access solution associated with a facility (e.g., a deployment of an access control system) and display the solution in various manners configured to increase user understanding. Accordingly, embodiments of the present disclosure can allow users to readily visualize and/or validate determined access solutions in various manners.

In the following detailed description, reference is made to the accompanying drawings that form a part hereof. The drawings show by way of illustration how one or more embodiments of the disclosure may be practiced.

These embodiments are described in sufficient detail to enable those of ordinary skill in the art to practice one or more embodiments of this disclosure. It is to be understood that other embodiments may be utilized and that process changes may be made without departing from the scope of the present disclosure.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure, and should not be taken in a limiting sense.

The figures herein follow a numbering convention in which the first digit or digits correspond to the drawing figure number and the remaining digits identify an element or component in the drawing. Similar elements or components between different figures may be identified by the use of similar digits.

As used herein, "a" or "a number of" something can refer to one or more such things. For example, "a number of spaces" can refer to one or more spaces.

FIG. 1 is an example of a display 100 associated with a plurality of two-dimensional spaces extracted from a building information model of a facility according to one or more embodiments of the present disclosure. Display 100 may illustrate a floor of a facility (e.g., a building, plant, refinery, etc.), for instance. Display 100 can be displayed by computing device 750 (e.g., user interface 756 of computing device 750) described in connection with FIG. 7.

As shown in the example illustrated in FIG. 1, display 100 can include a plurality of extracted spaces (e.g., extracted spaces 102, 104, 106, and 108 (generally referred to herein as spaces 102-108). Spaces 102-108 can represent areas, rooms, sections, etc. of a facility. Each of spaces 102-108 can be defined by a number of walls, for instance. It is to be understood that though certain spaces are discussed as examples herein, embodiments of the present disclosure are not limited to a particular number and/or type of spaces.

Spaces 102-108 can be extracted from a building information model (BIM) (e.g., a three-dimensional model) and/or from BIM data via a projection method (e.g., by projecting 3D objects of the BIM onto a 2D plan), for instance. Spaces 102-108 can be polygons, though embodiments of the present disclosure are not so limited. Various information and/or attributes associated with each of spaces 102-108 (e.g., semantic information, name, Globally Unique Identifier (GUID), etc.) can be extracted from the BIM and/or BIM data along with the spaces themselves.

Connections (e.g., relationships, openings and/or doors) between spaces 102-108 can also be extracted from BIM data. A given space in a facility may be connected to another space via a door, for instance. Similarly, spaces extracted from BIM data may be connected via a graphical and/or semantic representation of a door. Additionally, spaces extracted from BIM data may be connected by a "virtual door." For example, though a room may be a contiguous open space (e.g., having no physical doors therein), a BIM model associated with the room may partition the room into multiple (e.g., 2) spaces. Embodiments of the present disclosure can determine a connection between the spaces, as will further be described herein (e.g., in connection with FIG. 2).

Figure 2:
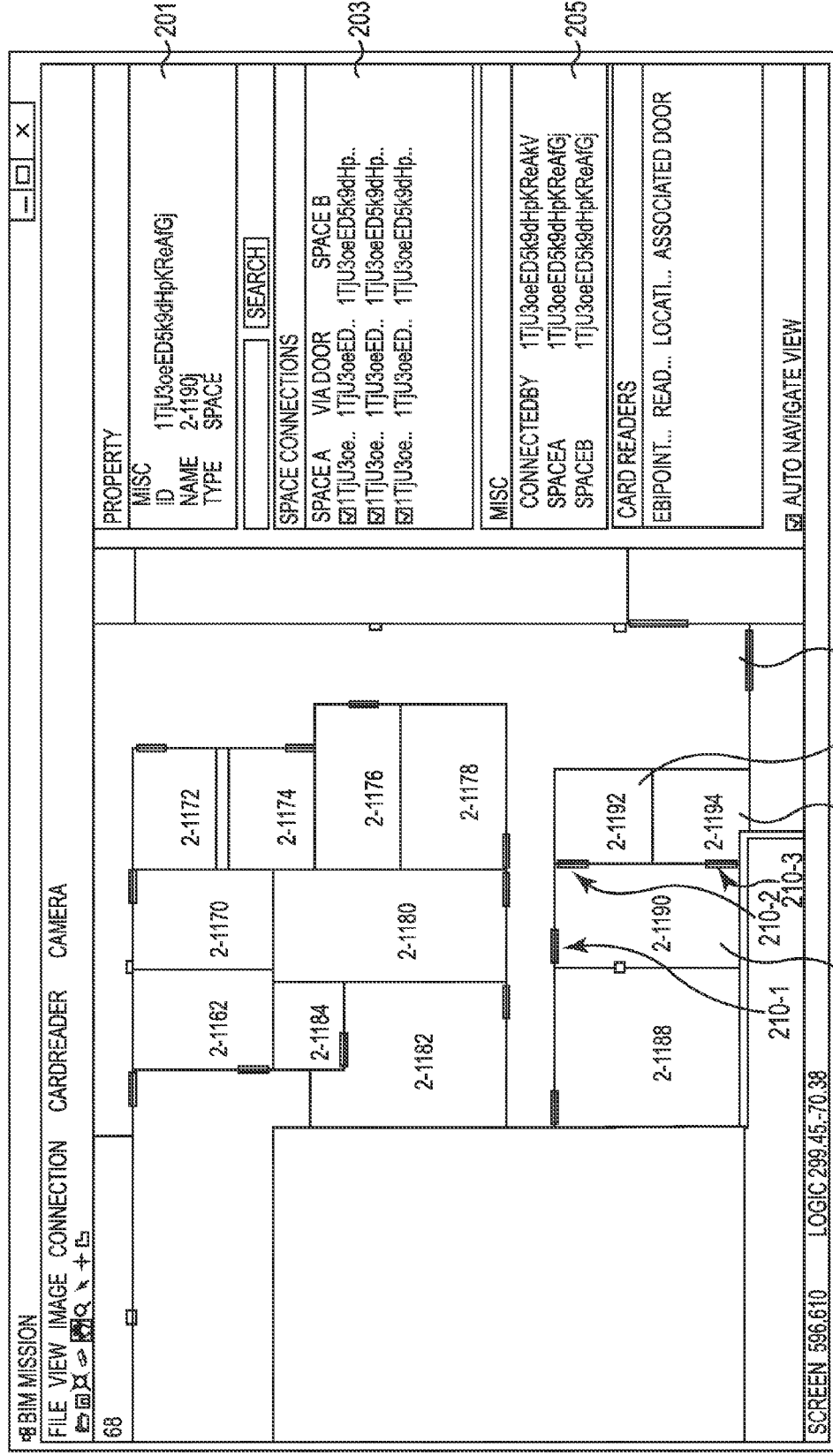
FIG. 2 is an example of a display associated with connections between a plurality of two-dimensional spaces extracted from a building information model of a facility according to one or more embodiments of the present disclosure.

FIG. 2 is an example of a display 200 associated with connections between a plurality of two-dimensional spaces extracted from a building information model of a facility according to one or more embodiments of the present disclosure.

In a manner analogous to display 100, display 200 includes a space 202, a space 204, a space 206, and a space 208. Display 200 can include a property window 201 configured to display various properties of a highlighted space (e.g., ID, name, type, etc.). As shown in the example illustrated in FIG. 2, space 202 (e.g., room 2-1190) has been highlighted. Display 200 can include a space connections window 203 configured to display connections between the highlighted space and other spaces. As shown in FIG. 2, display 200 can include a miscellaneous window 205 configured to display additional information associated with the highlighted space 202.

Connections can be determined in various ways. In some embodiments, connections between spaces may be defined (e.g., pre-defined) by the BIM model from which the spaces were extracted. In such embodiments, a query can be made by a user to determine the connections. For example, walls of a facility (e.g., all walls of a facility) can be provided responsive to a query of "IfcRelSpaceBoundary." To determine openings (e.g., doors) between any of the spaces, the user can make another query. For example, the query "IfcRelVoidsElement" can yield an IfcOpeningElement having a predefined type "OPENING." Another query "IfcRelFillsElement" can yield a RelatedBuildingElement of type IfcDoor.

In some embodiments, spatial reasoning (e.g., one or more geometry algorithms) can be used to determine connections between spaces responsive to a user input. For example, polygons of doors of space 202 can be determined to intersect with a boundary of space 202. Continuing in the example, another space (e.g., space 204) can be determined to be connected to space 202 if a boundary of space 204 intersects with the door of space 202.

As shown in FIG. 2, space 202 has been determined to have three connections with other spaces: a connection 210-1, a connection 210-2, and a connection 210-3. The connections 210-1, 210-2, and 210-3 connect space 202 to space 208, space 206, and space 204, respectively.

Once connections between spaces of a facility are determined, a user can define one or more access zones of the facility (generally referred to herein as "zones"). Such zones can include a subset of the spaces (and a subset of the connections between the spaces), and can be used to selectively allow access to different areas of the facility depending on a role of a person inside the facility (as will be further described herein).

Figure 3:
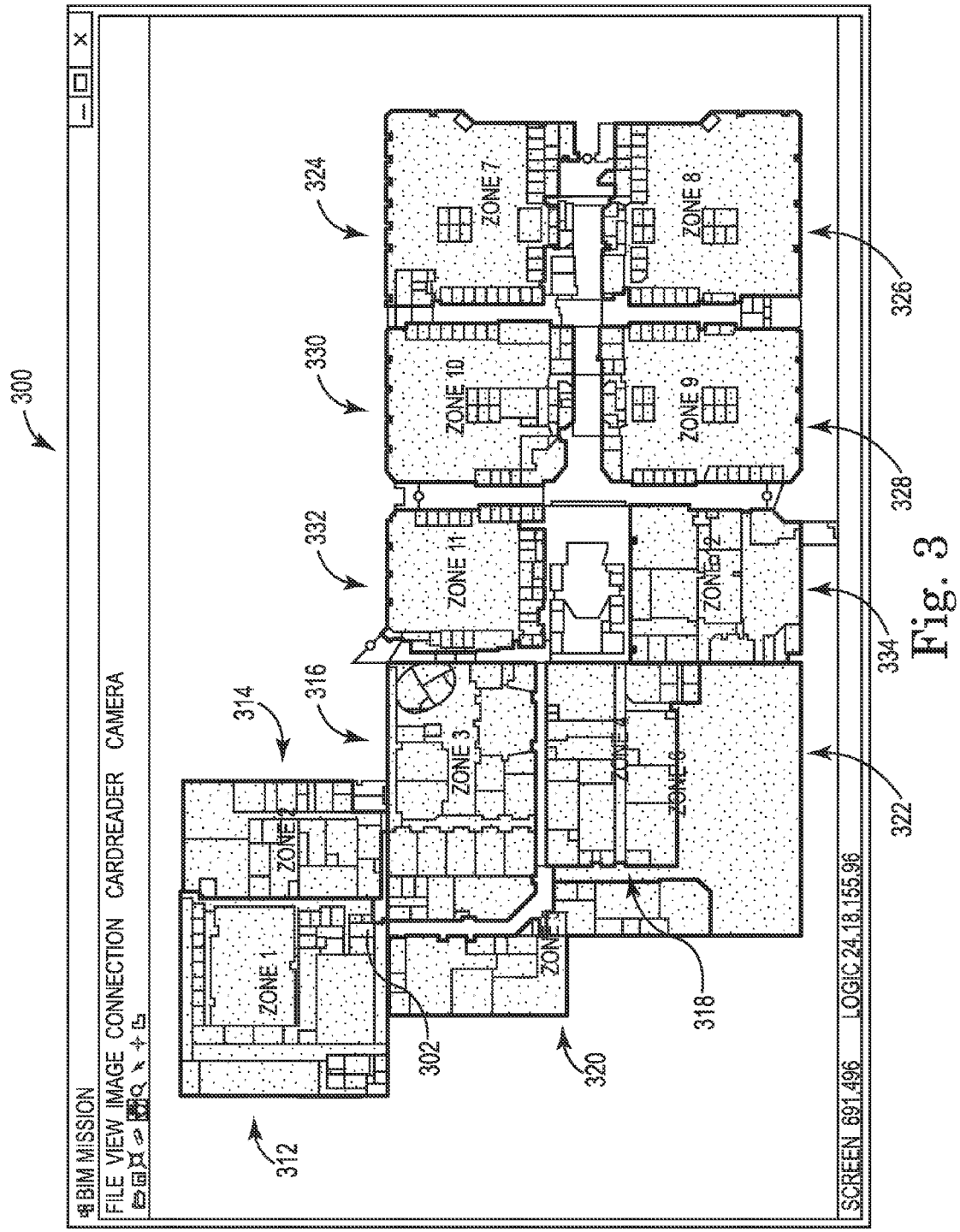
FIG. 3 is an example of a display associated with a plurality of access zones of a facility according to one or more embodiments of the present disclosure.

FIG. 3 is an example of a display 300 associated with a plurality of access zones of a facility according to one or more embodiments of the present disclosure.

Embodiments of the present disclosure can allow a user to select one or more spaces to define an access zone of a facility. For example, a user can use a mouse to drag a rectangle over a plurality of spaces to select the spaces. The selected spaces can be associated with a particular zone responsive to a user input. One or more spaces can be added to the zone or removed from the zone by individual mouse clicks, for instance.

As shown in FIG. 3, display 300 includes a plurality of defined zones: a zone 312, a zone 314, a zone 316, a zone 318, a zone 320, a zone 322, a zone 324, a zone 326, a zone 328, a zone 330, a zone 332, and a zone 334. Zone 312 includes a space 302 analogous to space 102 and/or space 202 previously discussed in connection with FIGS. 1 and 2, respectively.

Zones can be displayed in display 300 using particular colors, for example. Each zone can be displayed using a different (e.g., respective and/or unique) color. However, embodiments of the present disclosure are not so limited; for example, any of the colors can be changed by a user.

Once defined, embodiments of the present disclosure can use the connections between the spaces, previously discussed, to check the zones for consistency and/or potential problems. For example, embodiments can provide a notification to a user responsive to any space of the plurality of spaces not being included in a defined zone, a boundary of a zone not falling on a wall and/or door of the facility, a zone comprising one or more disjoint spaces, and/or a space belonging to more than one zone.

Once defined, access readers can be associated with the zones. For example, embodiments of the present disclosure can determine locations of doors associated with each zone (e.g., responsive to a user input). If a door connects a first space to a second space, and the first space belongs to a particular zone but the second space does not belong to the particular zone, embodiments of the present disclosure can determine that the door is on a boundary of the particular zone.

Access readers (e.g., simulated access readers and/or graphical renderings of access readers) can be associated with doors on boundaries of zones. That is, a respective access reader can be associated with each connection located on a boundary of the zone. In some embodiments, one or more doors of a facility may be permanently locked. If a door is permanently locked, embodiments of the present disclosure can remove an access reader that may have been associated with that door and/or change a status of the door to "locked."

In some embodiments, access to a zone may be allowed by an access reader associated with a door to the zone. Whether or not a particular person is allowed access to a zone may depend on that person's role. A role, as referred to herein, can be a level and/or degree of privilege (e.g., access rights and/or security clearance). A person's role can define to which zone(s) he or she is allowed access. A person's role can be stored on a token (e.g., an access card), for instance. The token can be configured to be read by any of the access readers previously discussed.

Different roles may have different privileges with respect to a particular zone. In a facility, roles can include a manager, an employee, a visitor, and a maintenance worker (e.g., maintainer), for instance, though such examples are not to be taken in a limiting sense.

Figure 4:
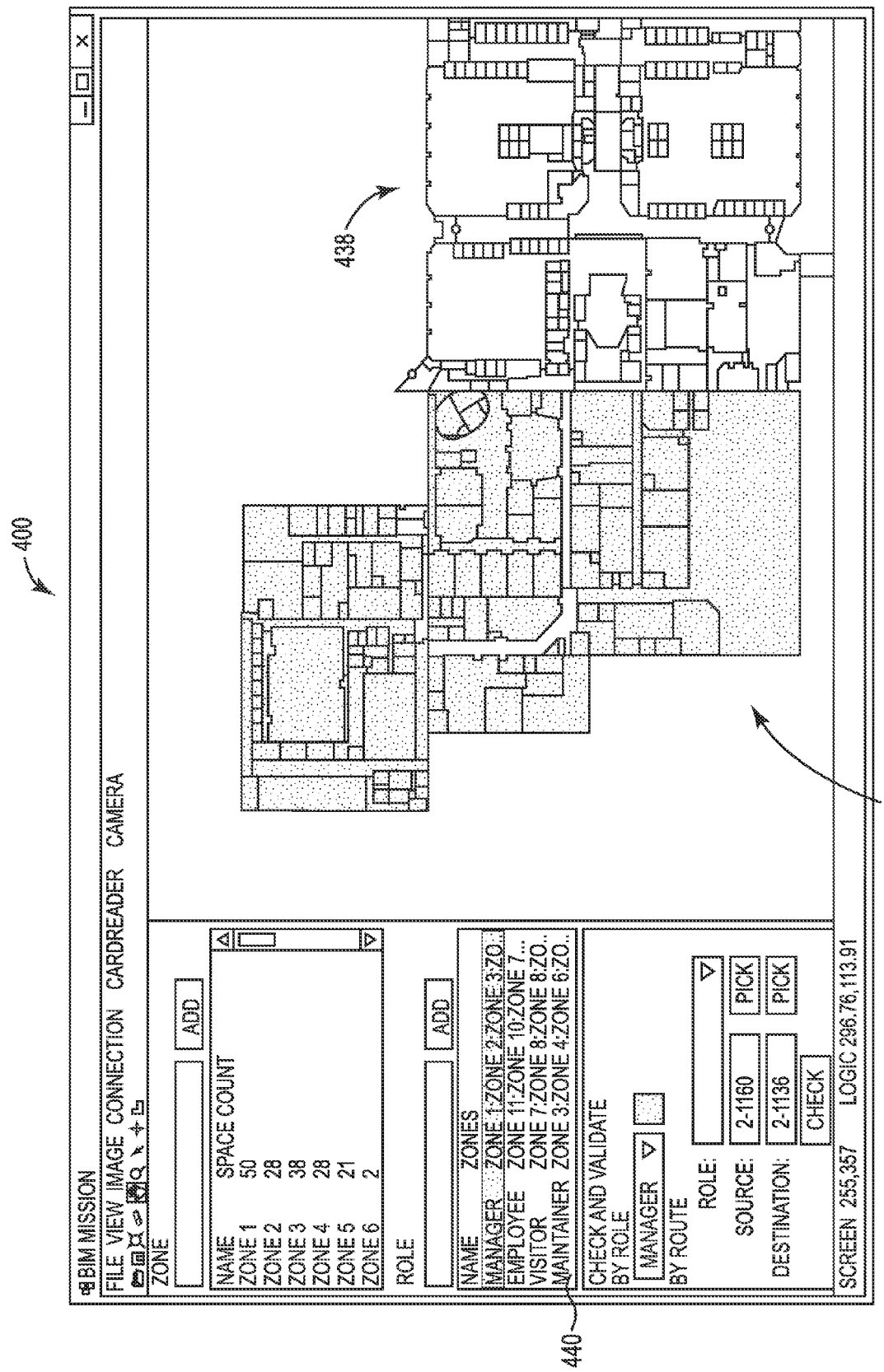
FIG. 4 is an example of a display associated with selectively allowing roles access to zones of a facility according to one or more embodiments of the present disclosure.

FIG. 4 is an example of a display 400 associated with selectively allowing roles access to zones of a facility according to one or more embodiments of the present disclosure.

As shown in FIG. 4, display 400 can include a role window 440 configured to allow a user to add (e.g., typographically input) a role. Once input, role(s) can be selected and/or highlighted (e.g., by clicking on them) using role window 440. A highlighted role can then be associated with a particular zone via an input associated with the zone (e.g., by clicking on the zone). Accordingly, a user can indicate that a particular role is allowed access to a zone via one or more access readers of the zone by clicking on the zone, for instance. As shown in role window 440, roles can be associated with (e.g., allowed to access) more than one zone.

In some embodiments, an access solution associated with the facility can be determined. Determining the access solution can include defining the plurality of zones of the facility, defining a respective subset of the plurality of zones to which each of a plurality of roles is allowed access, locating at least one opening associated with an outer boundary of each zone, and associating a simulated access reader with the at least one opening.

Embodiments of the present disclosure can allow the validation of an access solution in various manners. For example, as shown in FIG. 4, highlighting a particular role (e.g., Manager) can result in the display (e.g., highlighting) of any zones of the facility to which that role is allowed access. Each of the zones to which a particular role is allowed access can be displayed using a same color (e.g., green). As shown in FIG. 4, an accessible portion 436 is highlighted while an inaccessible portion 438 is not. Accordingly, the user can easily view and/or check which roles are allowed access to which zones of a facility.

Access solutions can be validated based on one or more routes taken through a facility. A route (e.g., path) taken by a particular role between two spaces can be displayed to determine and/or verify that access readers of the facility are located and/or configured correctly.

Figure 5:
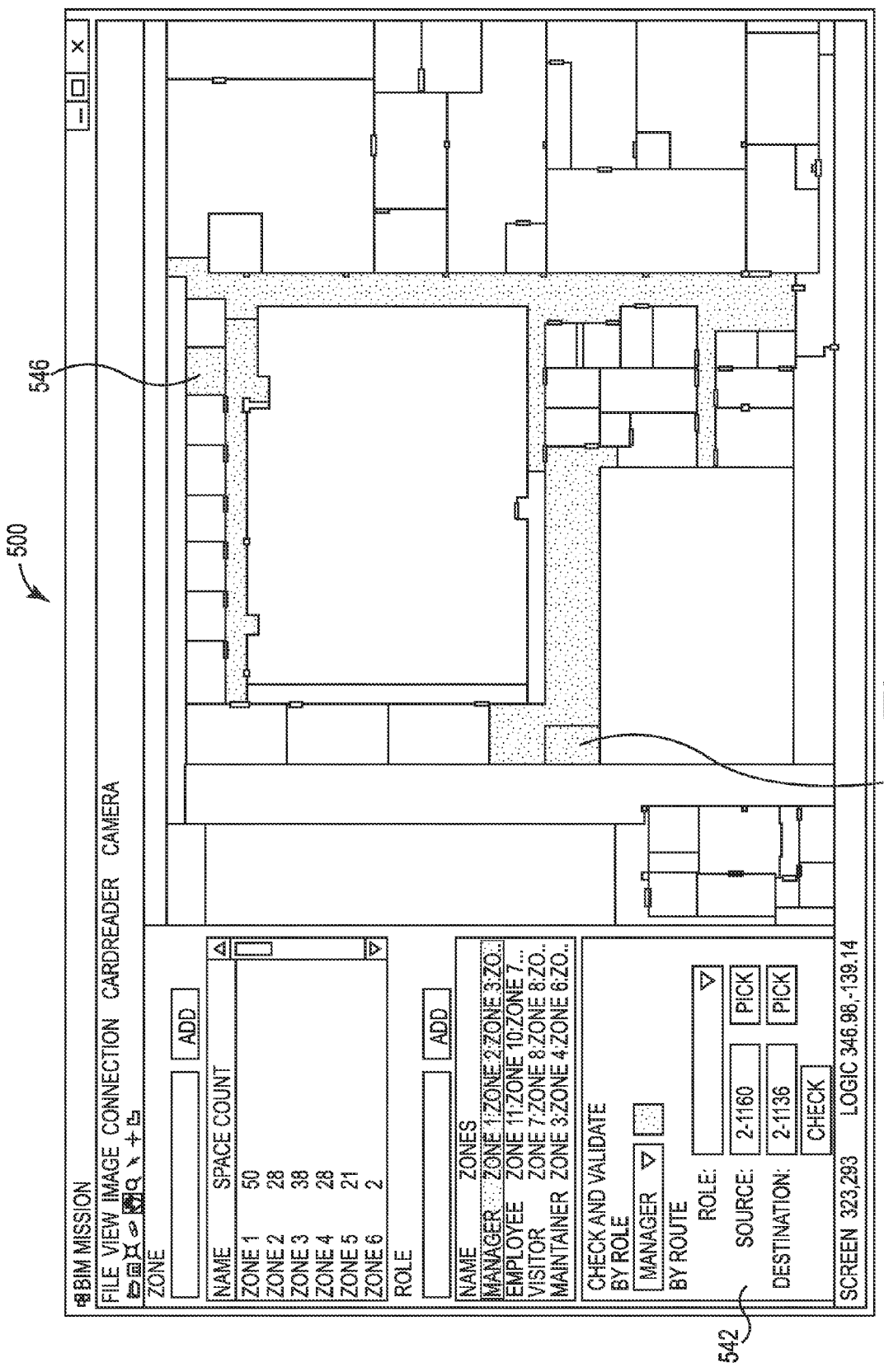
FIG. 5 is an example of a display associated with validating an access solution based on a route through a facility according to one or more embodiments of the present disclosure.

FIG. 5 is an example of a display 500 associated with validating an access solution based on a route through a facility according to one or more embodiments of the present disclosure.

As shown in FIG. 5, display 500 can include a route window 542 allowing a user to input a role, a source space (shown in display 500 as source space 544), and a destination space (shown in display 500 as destination space 546). Using the determined connections between the spaces, for instance, embodiments of the present disclosure can determine a route from the source space 544 to the destination space 546. As shown in FIG. 5, the route (e.g., any spaces along the route) can be highlighted and/or displayed using a particular color. Various embodiments can allow the user to visualize routes between spaces for a given role.

Figure 6:
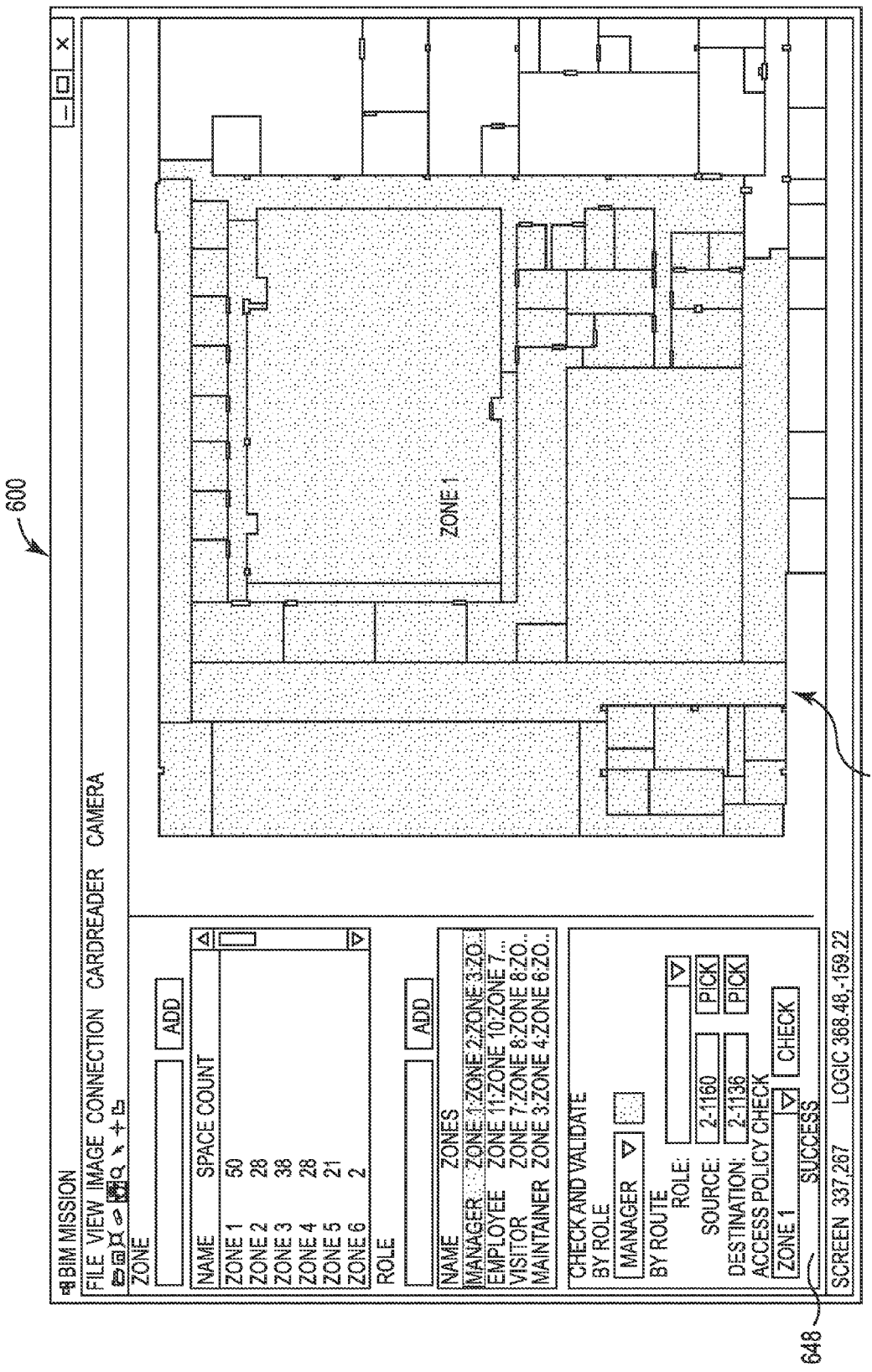
FIG. 6 is an example of a display associated with validating an access solution for a particular zone based one or more access readers associated with the zone according to one or more embodiments of the present disclosure.

FIG. 6 is an example of a display 600 associated with validating an access solution for a particular zone based one or more access readers associated with the zone according to one or more embodiments of the present disclosure.

As shown in FIG. 6, display 600 can include a check window 648. Using the check window 648, a user can select a particular zone of the facility and activate an element to determine if the access readers associated with the particular zone are correctly configured. For example, access readers associated with a particular zone should allow access to a role that is granted access (e.g., by a user determination). The role can access the zone via any of the card readers associated with the zone. As shown in FIG. 6, check window 648 can include an indicator (e.g., "success") if the access solution is determined to be compatible with all of its associated access readers. If the access solution is determined to not be compatible with all of its associated access readers, embodiments of the present disclosure can display a different indicator (e.g., "failure") and/or indicate which access reader(s) are not compatible with the solution.

Figure 7:
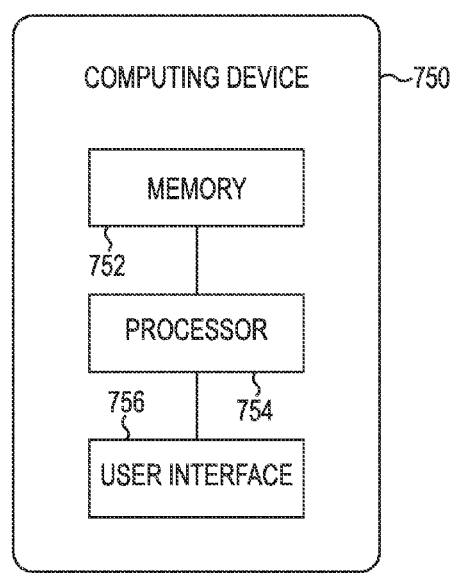
FIG. 7 illustrates a computing device for determining a deployment of an access control system according to one or more embodiments of the present disclosure.

FIG. 7 illustrates a computing device 750 for determining a deployment of an access control system according to one or more embodiments of the present disclosure. Computing device 750 can be, for example, a laptop computer, a desktop computer, or a mobile device (e.g., a mobile phone, a personal digital assistant, etc.), among other types of computing devices.

As shown in FIG. 7, computing device 750 includes a memory 752 and a processor 754 coupled to memory 752. Memory 752 can be any type of storage medium that can be accessed by processor 754 to perform various examples of the present disclosure. For example, memory 752 can be a non-transitory computer readable medium having computer readable instructions (e.g., computer program instructions) stored thereon that are executable by processor 754 to determine a deployment of an access control system in accordance with one or more embodiments of the present disclosure.

Memory 752 can be volatile or nonvolatile memory. Memory 752 can also be removable (e.g., portable) memory, or non-removable (e.g., internal) memory. For example, memory 752 can be random access memory (RAM) (e.g., dynamic random access memory (DRAM) and/or phase change random access memory (PCRAM)), read-only memory (ROM) (e.g., electrically erasable programmable read-only memory (EEPROM) and/or compact-disc read-only memory (CD-ROM)), flash memory, a laser disc, a digital versatile disc (DVD) or other optical disk storage, and/or a magnetic medium such as magnetic cassettes, tapes, or disks, among other types of memory.

Further, although memory 752 is illustrated as being located in computing device 750, embodiments of the present disclosure are not so limited. For example, memory 752 can also be located internal to another computing resource (e.g., enabling computer readable instructions to be downloaded over the Internet or another wired or wireless connection). Although not shown in FIG. 7, computing device 750 can include a display. The display can be configured to display one or more embodiments herein (e.g., any of displays 100, 200, 300, 400, 500, and/or 600), for instance.

As shown in FIG. 7, computing device 750 can also include a user interface 756. User interface 756 can include, for example, a display (e.g., a screen). The display can be, for instance, a touch-screen (e.g., the display can include touch-screen capabilities).

User interface 756 (e.g., the display of user interface 756) can provide (e.g., display and/or present) information to a user of computing device 750. For example, user interface 756 can provide displays 100, 200, 300, 400, 500, and/or 600 previously described in connection with FIGS. 1-6 to the user.

Additionally, computing device 750 can receive information from the user of computing device 750 through an interaction with the user via user interface 756. For example, computing device 750 (e.g., the display of user interface 756) can receive input from the user via user interface 756. The user can enter the input into computing device 750 using, for instance, a mouse and/or keyboard associated with computing device 750, or by touching the display of user interface 756 in embodiments in which the display includes touch-screen capabilities (e.g., embodiments in which the display is a touch screen).

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A method for determining a deployment of an access control system, comprising:
   extracting a plurality of two-dimensional spaces and a plurality of pre-defined connections between the plurality of spaces from a building information model of a facility using a computing device;
   determining which of the plurality of pre-defined connections are doors and which of the plurality of pre-defined connections are virtual doors, wherein a virtual door includes a connection between at least two spaces partitioned by the building information model of the facility;
   defining a zone of the facility, wherein the zone includes a subset of the plurality of spaces and a subset of the plurality of pre-defined connections between the spaces, and wherein a notification indicating at least one of the plurality of spaces belong to more than one zone is displayed on a display of a computing device once the zone of the facility is defined;
   associating an access reader with a particular connection of the subset of the plurality of pre-defined connections determined to be a door and located on a boundary of the zone; and
   displaying the zone and the associated access reader on the display of the computing device.

2. The method of claim 1, wherein the method includes:
   receiving an indication that a particular role is allowed access to the zone via the access reader; and
   displaying the zone in a particular color via a graphical rendering of the facility.

3. The method of claim 1, wherein the method includes determining the plurality of connections between the spaces responsive to a user query.

4. The method of claim 1, wherein the method includes allowing a user to define the zone via a selection of the subset of the plurality of the spaces.

5. The method of claim 1, wherein the method includes defining a plurality of zones of the facility.

6. The method of claim 1, wherein the method includes providing a notification responsive to any space of the plurality of spaces not being included in the zone of the facility.

7. The method of claim 1, wherein the method includes removing the access reader associated with the particular connection of the subset of the plurality of pre-defined connections determined to be a door and located on the boundary of the zone responsive to a determination that the particular connection is a permanently locked door.

8. The method of claim 1, wherein the method includes:
   indicating that a particular role is allowed access to the zone via the access reader; and
   displaying the zone and the particular role allowed access to the zone.

9. The method of claim 1, wherein the method includes allowing a user to select a particular role and associate the particular role with a particular zone via an input associated with the particular zone.

10. The method of claim 1, wherein the method includes:
    displaying a source space of the facility;
    displaying a destination space of the facility; and
    displaying a route from the source space to the destination space.

11. A computing device for determining a deployment of an access control system, comprising:
    a display;
    a memory; and
    a processor configured to execute executable instructions stored in the memory to:
       extract a plurality of two-dimensional spaces and a plurality of pre-defined connections between the plurality of two-dimensional spaces from a building information model of a facility;
       determine which of the plurality of pre-defined connections are doors and which of the plurality of pre-defined connections are virtual doors, wherein a virtual door includes a connection between at least two spaces partitioned by the building information model of the facility;
       allow a user to define a plurality of zones of the facility via the display, each of the plurality of zones including a respective subset of the plurality of spaces and a respective subset of the plurality of pre-defined connections determined to be doors, and wherein a notification indicating at least one of the plurality of spaces belong to more than one zone is displayed on the display of the computing device once the plurality of zones of the facility are defined; and
       for each of the plurality of zones:
          associate a respective access reader with each of the plurality of pre-defined connections determined to be a door and located on a boundary of the zone.

12. The computing device of claim 11, wherein the instructions are executable by the processor to, for each of the plurality of zones, receive an indication that a role is allowed access to the zone via the access reader.

13. The computing device of claim 11, wherein the instructions are executable by the processor to:
    determine a route between two of the plurality of spaces based on the plurality of pre-defined connections; and determine a role allowed access to the route via at least one access reader on the route.

14. A non-transitory computer readable medium having computer readable instructions stored thereon that are executable by a processor to:
- extract a plurality of two-dimensional spaces and a plurality of pre-defined connections between the plurality of spaces from a three-dimensional building information model of a facility;
- determine a plurality of openings connecting the spaces;
- determine which of the plurality of openings are doors and which of the plurality of openings are virtual doors, wherein a virtual door includes a connection between at least two spaces partitioned by the building information model of the facility;
- determine an access solution associated with the facility, wherein the instructions to determine the access solution include instructions to:
  - define a plurality of zones of the facility, wherein each of the plurality of zones includes at least one of the spaces, and wherein a notification indicating at least one of the plurality of spaces belong to more than one zone is displayed on a display of a computing device once the plurality of zones of the facility are defined;
  - define a respective subset of the plurality of zones to which each of a plurality of roles is allowed access;
  - locate at least one opening determined to be a door and associated with an outer boundary of each of the plurality of zones;
  - associate a simulated access reader with the at least one opening determined to be a door; and
  - display the plurality of zones and the associated simulated access reader with the at least one opening determined to be a door on the display of the computing device.

15. The computer readable medium of claim 14, wherein the instructions are executable by the processor to display each of the plurality of zones using a different color.

16. The computer-readable medium of claim 15, wherein the instructions are executable by the processor to allow a user to change each of the different colors.

17. The computer readable medium of claim 14, wherein the instructions include instructions executable by the processor to:
- determine a route from a first space of the plurality of spaces to a second space of the plurality of spaces; and
- display the determined route.

18. The computer readable medium of claim 14, wherein the instructions are executable by the processor to display each of a subset of the plurality of zones to which a particular role is allowed access using a same color.

* * * * *